US011349030B2

(12) United States Patent
Shu et al.

(10) Patent No.: US 11,349,030 B2
(45) Date of Patent: May 31, 2022

(54) METHODS OF FORMING TRANSISTOR DEVICES COMPRISING A SINGLE SEMICONDUCTOR STRUCTURE AND THE RESULTING DEVICES

(71) Applicant: GLOBALFOUNDRIES U.S. Inc., Santa Clara, CA (US)

(72) Inventors: Jiehui Shu, Clifton Park, NY (US); Haiting Wang, Clifton Park, NY (US); Hong Yu, Rexford, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 35 days.

(21) Appl. No.: 16/739,299

(22) Filed: Jan. 10, 2020

(65) Prior Publication Data

US 2021/0217887 A1 Jul. 15, 2021

(51) Int. Cl.

| H01L 29/78 | (2006.01) |
|---|---|
| H01L 27/088 | (2006.01) |
| H01L 29/66 | (2006.01) |
| H01L 21/762 | (2006.01) |
| H01L 21/02 | (2006.01) |

(52) U.S. Cl.
CPC ...... *H01L 29/785* (2013.01); *H01L 21/76224* (2013.01); *H01L 27/0886* (2013.01); *H01L 29/66795* (2013.01); *H01L 29/7827* (2013.01); *H01L 21/02337* (2013.01); *H01L 21/02356* (2013.01)

(58) Field of Classification Search
CPC ............... H01L 21/762; H01L 27/0886; H01L 29/7827; H01L 21/02337; H01L 21/02356; H01L 21/823431; H01L 21/823821; H01L 27/1211; H01L 27/0924; H01L 27/10879; H01L 29/41791; H01L 29/66795–66818; H01L 29/785–7856; H01L 2029/7858; H01L 2924/13067; H01L 21/845; H01L 21/7624
See application file for complete search history.

(56) References Cited

U.S. PATENT DOCUMENTS

| 2009/0127648 A1 | 5/2009 | Chen et al. |
| 2010/0230757 A1 | 9/2010 | Chen et al. |
| 2015/0014807 A1 | 1/2015 | Chuang et al. |
| 2019/0067078 A1* | 2/2019 | Belyansky ........ H01L 21/02321 |

(Continued)

*Primary Examiner* — Cuong B Nguyen
(74) *Attorney, Agent, or Firm* — Francois Pagette; Hoffman Warnick LLC (57) ABSTRACT

A transistor device that includes a single semiconductor structure having an outer perimeter and a vertical height, wherein the single semiconductor structure is at least partially defined by a trench formed in a semiconductor substrate and a first layer of material positioned on the bottom surface of the trench and around the outer perimeter of the single semiconductor structure. The device also includes a second layer of material positioned on the first layer of material and around the outer perimeter of the single semiconductor structure, a gap between the outer perimeter of the single semiconductor structure and both the first and second layers of material (when considered collectively) and an insulating sidewall spacer positioned in the gap, wherein the insulating sidewall spacer has a vertical height that is less than the vertical height of the single semiconductor structure.

19 Claims, 7 Drawing Sheets

(56) References Cited

U.S. PATENT DOCUMENTS

| | | | |
|---|---|---|---|
| 2019/0067417 A1* | 2/2019 | Ching | H01L 29/66545 |
| 2019/0157159 A1* | 5/2019 | Wen | H01L 21/762 |
| 2020/0027983 A1* | 1/2020 | Bentley | H01L 21/0228 |

* cited by examiner

METHODS OF FORMING TRANSISTOR DEVICES COMPRISING A SINGLE SEMICONDUCTOR STRUCTURE AND THE RESULTING DEVICES

BACKGROUND

Field of the Invention

The present disclosure generally relates to various novel methods of forming transistor devices comprising a single semiconductor structure and the resulting devices.

Description of the Related Art

Transistor devices come in a variety of configurations, e.g., planar devices, FinFET devices, vertical devices, etc. FinFETs are commonly employed in modern IC products. A FinFET device may comprise a single fin (i.e., a single semiconductor structure) or multiple fins (i.e., multiple semiconductor structures). Such a fin has a long axis that is oriented substantially horizontal relative to an upper surface of the semiconductor substrate on which the FinFET device is formed. A vertical transistor may also comprise a single semiconductor structure, i.e., a single vertically oriented semiconductor structure that has a long axis that is oriented substantially vertical relative to an upper surface of the substrate in which the vertical transistor device is formed. However, single-fin FinFET devices are becoming more popular in many IC products where low power consumption is important, e.g., mobile phones and portable computing devices. The same is true for vertical transistor devices. However, at least some of the traditional manufacturing processes used to form devices having a single semiconductor structure (e.g., FinFET and vertical devices) may have a tendency to increase the formation of undesirable crystalline defects in the fin of a single-fin FinFET device or in the single vertically oriented semiconductor structure in a vertical transistor device, which may lead to a reduction in the performance capabilities of the resulting device. More specifically, in some manufacturing techniques, a flowable oxide material (FCVD) may be initially formed so as to overfill the trenches adjacent the fin or the single vertically oriented semiconductor structure and thereafter cured by performing one or more anneal processes. Unfortunately, the one or more anneal processes cause the flowable oxide material to contract, which exerts a lateral or horizontal stress on the fin or the single vertically oriented semiconductor structure that tends to pull the fin or the single vertically oriented semiconductor structure apart. This stress on the fin or the single vertically oriented semiconductor structure tends to lead to the formation of the above-mentioned undesirable crystalline defects in the fin or the single vertically oriented semiconductor structure.

The present disclosure is generally directed to various novel methods of forming transistor devices comprising a single semiconductor structure and the resulting devices that may solve or at least reduce one or more of the problems identified above.

SUMMARY

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is directed to various novel methods of forming a transistor device that comprises a single semiconductor structure and the resulting devices. One illustrative method disclosed herein includes forming a single semiconductor structure in a semiconductor substrate, forming a liner layer of material around the single semiconductor structure and on a bottom surface of a trench located in the semiconductor substrate adjacent the single semiconductor structure, and forming a first insulating material within the trench and above a portion of the liner layer of material. In this example, the method also includes performing an etching process to remove portions of the liner layer of material not covered by the first insulating material while leaving a remaining portion of the liner layer of material positioned under the first insulating material in the trench, wherein the etching process results in the formation of a gap between the single semiconductor structure and the remaining portion of the liner layer and the first insulating material (considered collectively). The method also includes forming an insulating sidewall spacer in the gap.

One illustrative transistor device disclosed herein includes a single semiconductor structure having an outer perimeter and a vertical height, wherein the single semiconductor structure is at least partially defined by a trench formed in a semiconductor substrate and a first layer of material positioned on the bottom surface of the trench and around the outer perimeter of the single semiconductor structure. The device also includes a second layer of material positioned on the first layer of material and around the outer perimeter of the single semiconductor structure, a gap between the outer perimeter of the single semiconductor structure and both the first and second layers of material (when considered collectively), and an insulating sidewall spacer positioned in the gap, wherein the insulating sidewall spacer has a vertical height that is less than the vertical height of the single semiconductor structure.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the presently disclosed method may be applicable to a variety of products, including, but not limited to, logic products, memory products, etc. With reference to the attached figures, various illustrative embodiments of the methods and devices disclosed herein will now be described in more detail.

FIGS. 1-13 depict various novel methods of forming transistor devices comprising a single semiconductor structure and an integrated circuit (IC) product 100 that includes such devices. As will be appreciated by those skilled in the art, the presently disclosed subject matter is applicable to a variety of different devices that comprise a single semiconductor structure, such as a FinFET device comprising a single fin, a vertical transistor device comprising a single vertically oriented semiconductor structure, etc. For purposes of disclosure, reference will be made to an illustrative single-fin FinFET device, but such reference to the single-fin FinFET device should not be considered to be a limitation of the presently disclosed subject matter as the inventions disclosed herein may be employed when manufacturing other types of transistor devices.

In the illustrative examples depicted herein, two illustrative FinFET devices 101A, 101B (collectively referenced using the numeral 101) will be formed above a semiconductor substrate 102. As will be appreciated by those skilled in the art after a complete reading of the present application, the FinFET devices 101 disclosed herein may be N-type or P-type devices, and the FinFET devices 101A, 101B need not both be the same type of device, e.g., N-type devices, but that may be the case in some applications. Additionally, the gate structures of the FinFET devices 101 disclosed herein may be manufactured using known gate-first or replacement gate manufacturing techniques.

The substrate 102 may have a variety of configurations, such as the depicted bulk silicon configuration. The substrate 102 may also have a semiconductor-on-insulator (SOI) configuration that includes a bulk semiconductor layer, a buried insulation layer and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings. The various components, structures and layers of material depicted herein may be formed using a variety of different materials and by performing a variety of known process operations, e.g., chemical vapor deposition (CVD), atomic layer deposition (ALD), a thermal growth process, spin-coating techniques, etc. The thicknesses of these various layers of material may also vary depending upon the particular application. However, the various inventions disclosed herein should not be considered to be limited to the particular examples shown in the attached drawings and described below.

Figure 1:
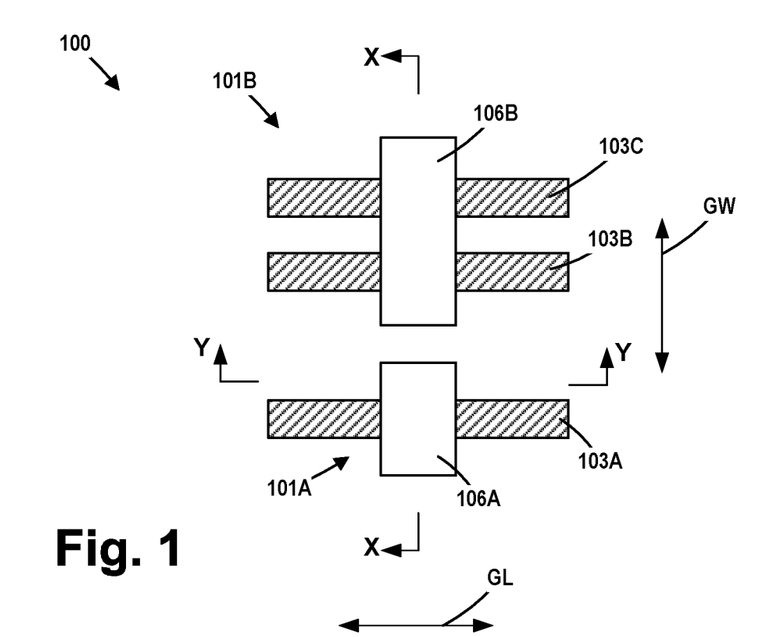
FIGS. 1-13 depict various novel methods of forming transistor devices comprising a single semiconductor structure and the resulting devices. The drawings are not to scale.

FIG. 1 is a simplistic plan view of one illustrative embodiment of an IC product 100 that includes the FinFET devices 101A, 101B that may be formed using the methods described herein. The gate length (GL) direction of the FinFET devices 101 is also depicted in FIG. 1. The location where the cross-sectional view ("X-X") of the FinFET devices 101 shown in the attached drawings are indicated in FIG. 1. The cross-sectional view X-X is taken in a direction corresponding to the gate width (GW) direction of the FinFET devices 101. The cross-sectional view Y-Y is taken through the gate 106A at a location above isolation material in a direction corresponding to the gate length (GL) direction of the FinFET devices 101.

With continued reference to FIG. 1, the FinFET device 101A comprises a single fin 103A (i.e., a single semiconductor structure) and a simplistically depicted gate 106A. The FinFET device 101B comprises two fins 103B, 103C (i.e., two semiconductor structures) and a gate 106B. The fins 103A-C will be collectively referenced using the numeral 103 and the terminology "fin" or "fins" will be used when referring to the semiconductor structures of such devices. The gates 106A, 106B will be collectively referenced using the numeral 106. Each of the gates 106 comprises a gate structure 120, a sidewall spacer 122 and a gate cap 124 as described more fully below. As will be appreciated by those skilled in the art after a complete reading of the present application, the FinFET device 101B may comprise two or more fins 103, e.g., the FinFET device 101B may comprise five fins 103.

Figure 2:
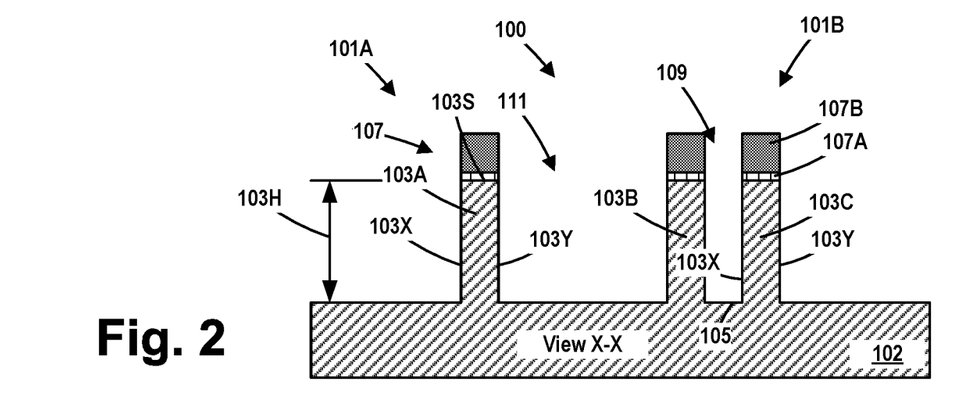

FIG. 2 depicts the IC product 100 after several process operations were performed. First, a patterned etch mask 107, e.g., a combination of a silicon dioxide layer 107A (e.g., a pad oxide) and a silicon nitride layer 107B (e.g., a pad nitride), was formed above the substrate 102 by performing known oxidation, deposition and patterning techniques. Thereafter, one or more etching processes were performed through the patterned etch mask 107 so as to define a plurality of fin-formation trenches 105 in the substrate 102. This etching process results in the formation of the plurality of fins 103 with opposing lateral sidewalls 103X, 103Y.

Figure 3:
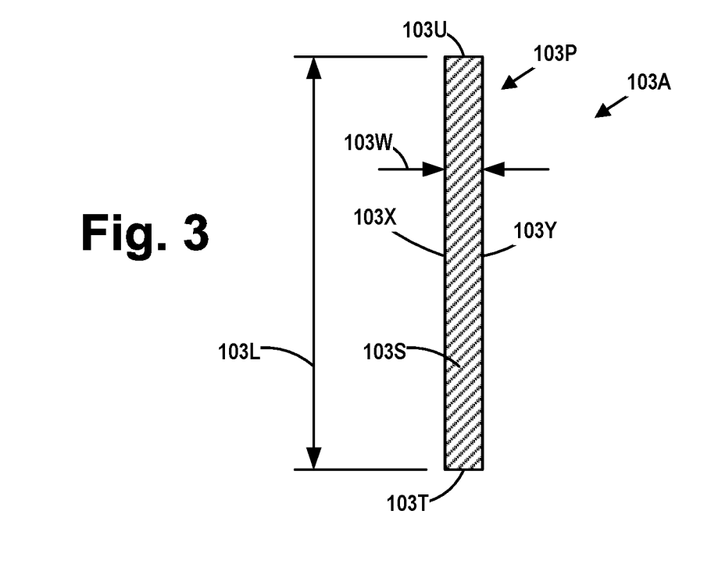

FIG. 3 is a plan view of the fin 103A. With reference to FIGS. 2 and 3, the fins disclosed herein generally have an upper surface 103S, an axial length 103L a width 103W (at the upper surface 103S), a height 103H, opposing lateral sidewalls 103X, 103Y, opposing end surfaces 103T, 103U, the dimensions of which may all vary depending upon the particular application. The long axis of the fin 103A (in a direction corresponding to the axial length 103L) is oriented substantially horizontal relative to an upper surface of the substrate 102. When viewed from above, the fin 103A has an outer perimeter 103P. Additionally, the overall size, shape and configuration of the fin-formation trenches 105 and fins 103 may vary depending upon the particular application. The fins 103 are simplistically depicted as having a substantially rectangular cross-sectional configuration. However, in a real-world device, the fins 103 may have a tapered configuration, i.e., the fins may be wider at the base of the fin 103 than at the top of the fin 103.

Figure 4:
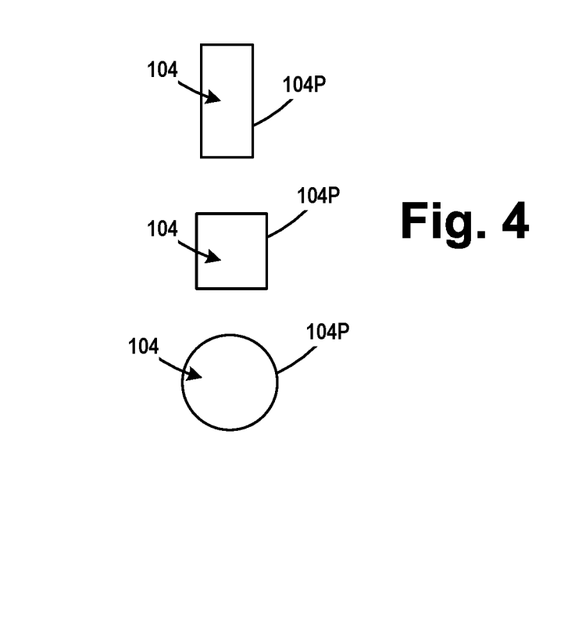

In the case wherein the single semiconductor structure is for a vertical transistor device, the single semiconductor structure, i.e., the vertically oriented semiconductor structure for the device, may also have a variety of cross-sectional configurations when viewed from above. FIG. 4 is a plan view of some possible configurations of the single semiconductor structure 104 and the resulting devices, e.g., circular, rectangular, square, etc. Also note that each configuration of the single semiconductor structure 104 has an outer perimeter 104P. The single semiconductor structure 104 also has an axial length (not shown) that extends in a direction that is oriented substantially vertical relative to an upper surface of the substrate 102. As with the fins 103, the size and cross-sectional configuration of the single semiconductor structure 104 when viewed from above may vary depending upon the particular application.

With continuing reference to FIG. 2, the fins 103B-C are formed with a relatively tight fin-pitch, i.e., there is a relatively small space 109 between the fins 103B-C. However, there is a relatively large space 111 between the fin 103A and the fin 103B. In one illustrative embodiment, based upon current-day technology, the spacing 109 may be about 30 nm, while the spacing 111 may be about 120 nm. The spacing of the fins 103 depicted in FIG. 2 may be achieved by directly patterning the substrate 102 such that the fins 103 have the depicted spacing or it may be achieved by forming fins across substantially the entire substrate 102 having a relative tight fin-pitch and thereafter removing some of the fins on both sides of the fin 103A by performing known fin-removal masking and etching processes.

Figure 5:
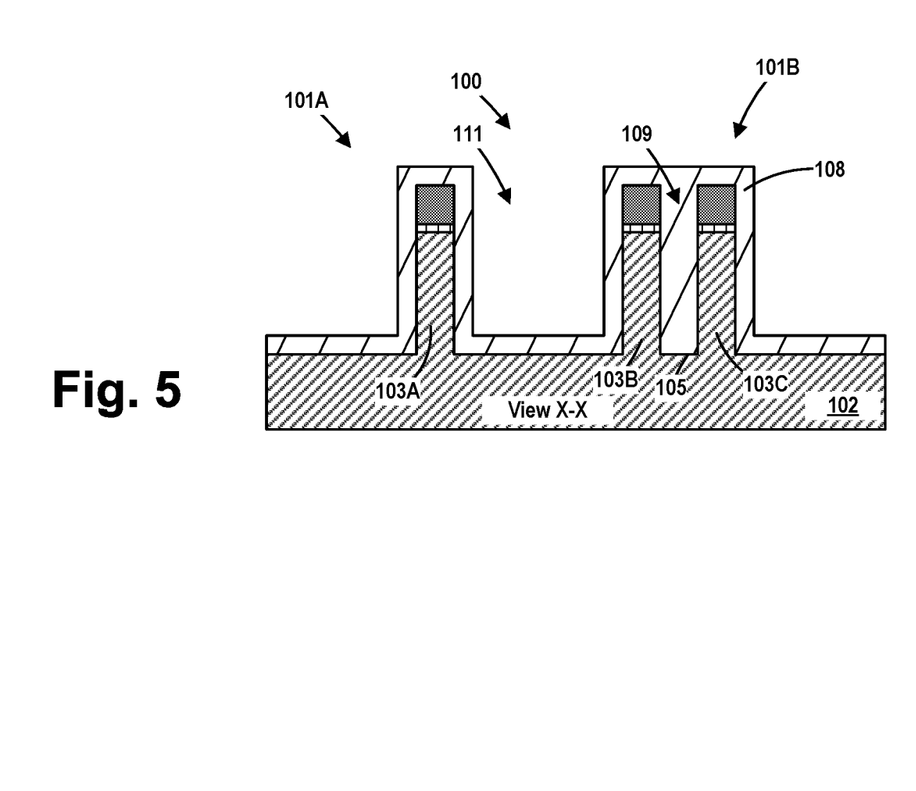

FIG. 5 depicts the IC product 100 after a conformal deposition process was performed to form a conformal liner layer 108 above the substrate 102 and around the outer perimeter of the fins 103. The conformal liner layer 108 may be comprised of a variety of different materials, e.g., aluminum oxide ($Al_2O_3$), silicon germanium (SiGe), titanium oxide ($TiO_2$), etc. In general, the conformal liner layer 108 should be made of a material that exhibits good etch selectivity relative to the material of the fins 103 and the interlayer dielectric (ILD) material that will be formed between the fins 103, such as silicon dioxide, as described more fully below. The conformal liner layer 108 may be formed to any desired thickness, e.g., 20-30 nm. Note that, due to the relatively small space 109 between the fins 103B-C, the conformal liner layer 108 pinches off and substantially overfills the space 109.

Figure 6:
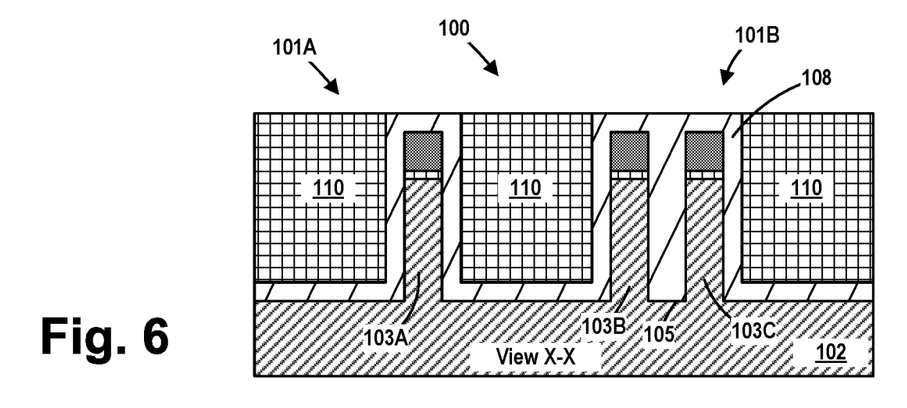

FIG. 6 depicts the IC product 100 after several process operations were performed. A first insulating material layer 110 was formed around the outer perimeter of the fins 103 so as to overfill the spaces between the fins 103. The first insulating material layer 110 may be comprised of a variety of different insulating materials, e.g., silicon dioxide, a high density plasma (HDP) oxide, a high aspect ratio process (HARP) oxide, etc. The first insulating material layer 110 may be formed by performing a blanket deposition process, e.g., a CVD process. As initially formed, the first insulating material layer 110 covers all of the conformal liner layer 108. Thereafter, one or more planarization processes (e.g., a CMP or etch-back process) was performed to remove portions of the first insulating material layer 110 using the conformal liner layer 108 as a polish-stop or an etch-stop.

Figure 7:
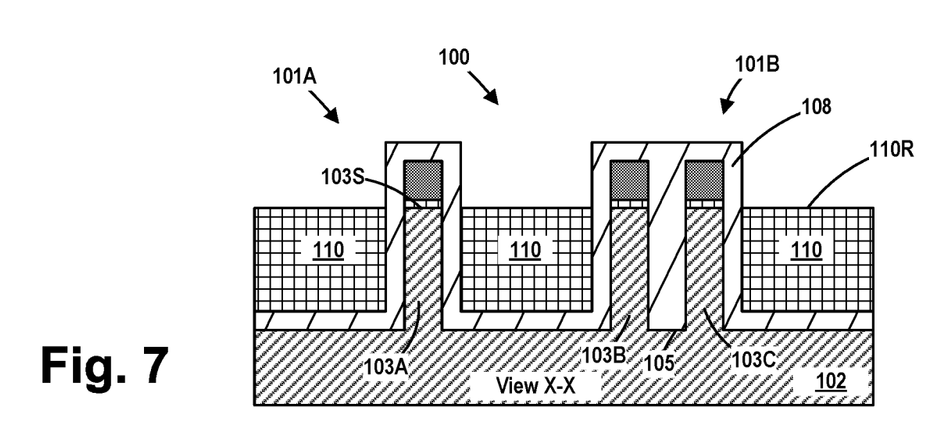

FIG. 7 depicts the IC product 100 after an optional timed, recess etching process was performed to remove a portion of the first insulating material layer 110. The recess etching process was performed for a sufficient duration such that the first insulating material layer 110 has a substantially planar recessed upper surface 110R that is positioned at a desired height level within the trenches 105 and around the outer perimeter of the fins 103. The amount of recessing of the first insulating material layer 110 may vary depending upon the particular application. In one illustrative example, the recessed upper surface 110R may be approximately level with or slightly below the upper surface 103S of the fins 103. As noted above, in some embodiments, the recess etching process described in this paragraph may not be performed.

Figure 8:
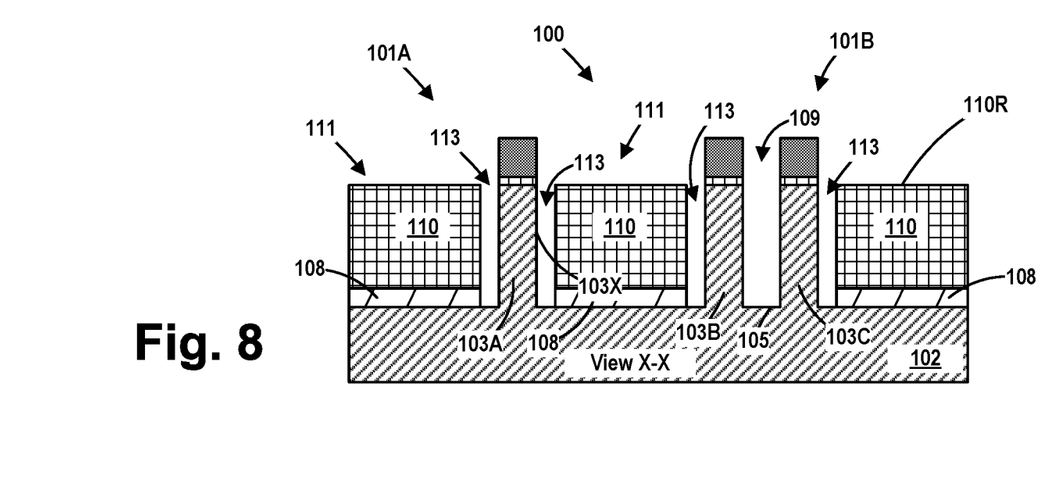

FIG. 8 depicts the IC product 100 after an anisotropic etching process was performed to remove exposed portions of the conformal liner layer 108. As depicted, portions of the conformal liner layer 108 remain positioned on the substrate 102 around the outer perimeter of the fins 103 below the first insulating material layer 110 which is also positioned around the outer perimeter of the fins 103. This combination of the conformal liner layer 108 and the first insulating material layer 110 is also located to the left of the fin 103B and to the right of the fin 103C. Note that the space 109 between the fins 103B-C is now substantially free of the conformal liner layer 108 and the first insulating material layer 110. Also note that the removal of portions of the conformal liner layer 108 results in the formation of a relatively small space or gap 113 between the outer perimeter 103P of the fin 103A and, when considered collectively, both the remaining portion of the conformal liner layer 108 and the first insulating material layer 110. The gap 113 extends around the entire outer perimeter of the fin 103A. In the depicted example, the gap 113 also exposes a portion of the bottom of the trench 105 around the entire outer perimeter of the fin 103A. The width of this gap or space 113 corresponds approximately to the thickness of the conformal liner layer 108. If desired, at this point in the process flow, an optional, relatively thin liner (not shown) may be formed in the gap 113 by performing known conformal deposition processes without overfilling the gap 113.

Figure 9:
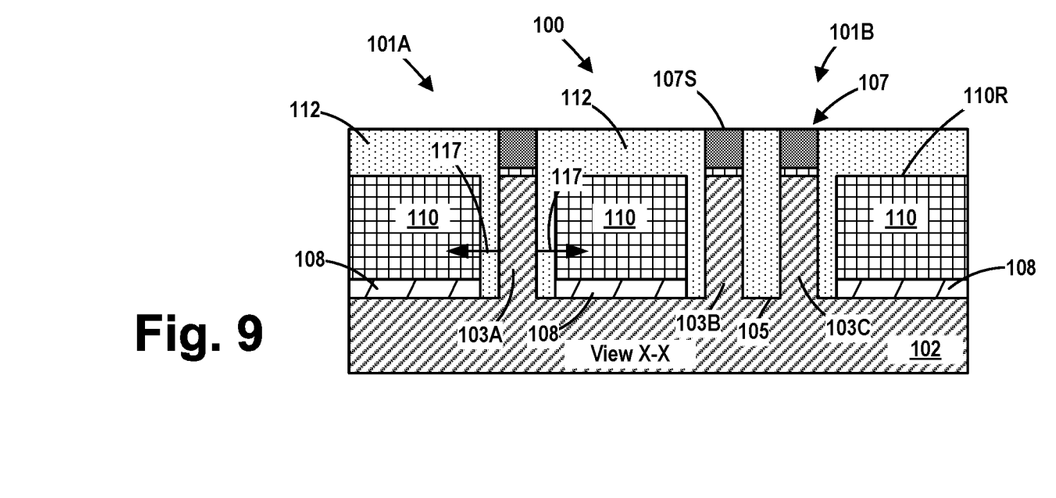

FIG. 9 depicts the IC product 100 after several process operations were performed. First, a process operation was performed to form a second insulating material layer 112 on the substrate 102 and around the outer perimeter of the fins 103. As depicted, in one illustrative embodiment, the second insulating material layer 112 may be formed in a manner such that it substantially overfills the gap 113. The second insulating material layer 112 may be comprised of a variety of different materials, e.g., a flowable oxide (FCVD), a spin-on oxide (SOD), etc. In one particular example, where the second insulating material layer 112 comprises a flowable oxide material, a spin-coating process may be initially formed to form a layer of the flowable oxide material that has an upper surface that is positioned above the upper surface 107S of the patterned etch mask 107.

Thereafter, the layer of flowable oxide material may be cured by performing one or more anneal processes. For example, in one illustrative embodiment, a first wet steam anneal process may be performed at a temperature of about 500-600° C. for a duration of about one hour. Thereafter, a dry anneal process may be performed in an inert ambient (e.g., nitrogen) at a temperature of about 1000° C. for a duration of about ten minutes. Performing these one or more anneal processes cures the flowable oxide material and improves the wet etch rate of the flowable oxide material. However, even after performing the one or more anneal processes, the flowable oxide material still has a hardness that is less than that of the first insulating material layer 110. Due to the greater hardness of the first insulating material layer 110, it is mechanically stronger than the lower-density second insulating material layer 112. Although the specific example described above applies where the second insulating material layer 112 comprises a flowable oxide material, other insulating materials could also be used, including materials that need not (but may) be formed by performing a spin coating process and thereafter the above-described one or more anneal processes.

Importantly, in the illustrative example where the second insulating material layer 112 comprises a flowable oxide material, the second insulating material layer 112 contracts during the above-described anneal processes. More specifically, in one illustrative embodiment, the second insulating material layer 112 may contract about 10% during the above-described first wet steam anneal process and it may contract about 5% during the above-described dry anneal process. The contraction of the second insulating material layer 112 as a result of performing the one or more anneal processes exerts stress (as indicated by the arrows 117) that tends to pull the fin 103A apart. The stress 117 tends to induce dislocations in the fin 103A, particularly when the bottom critical dimensions (at the base of the fin 103A) is relatively small, e.g., about 15 nm or less. However, due to the formation of the higher density first insulating material layer 110 on both sides of the fin 103A, there is less quantity of the second insulating material layer 112 that is formed on both sides of the fin 103A. That is, the second insulating material layer 112 cannot be formed in the volume occupied by the first insulating material layer 110. As a result, if the second insulating material layer 112 contracts during part of the process of forming the second insulating material layer 112, the amount or magnitude of the stress 117 exerted on the fin 103A is less than it would be if the first insulating material layer 110 had not been formed prior to the formation of the second insulating material layer 112. Accordingly, the likelihood of inducing dislocations on the fin 103A may be reduced using the method disclosed herein. At the point in processing depicted in FIG. 9, traditional manufacturing operations may be performed to complete the formation of the FinFET devices 101A, 101B.

Figure 10:
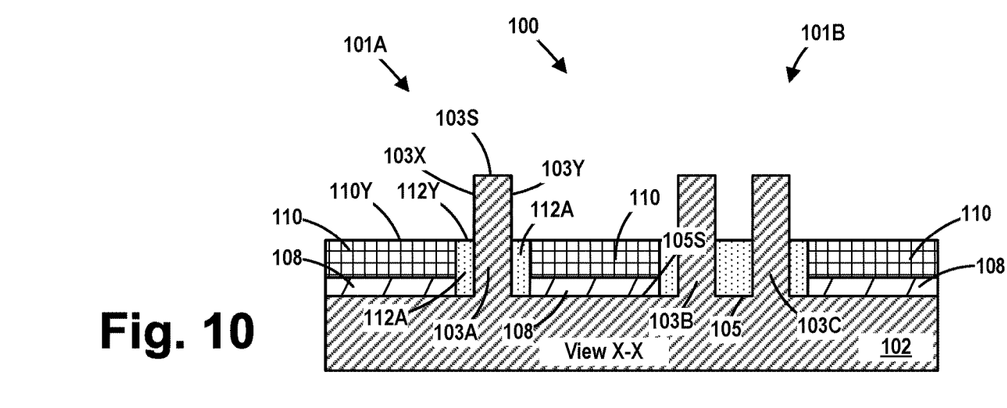

FIG. 10 depicts the IC product 100 after several process operations were performed. First, in one illustrative process flow, one or more CMP process operations were performed to remove portions of the second insulating material layer 112 and the patterned etch mask 107 using the upper surface 103S of the fins 103 as a polish-stop. As depicted in FIG. 10, this exposes the upper surface 103S of the fins 103. Thereafter, one or more timed, recess etching processes were performed to recess the first insulating material layer 110 and the second insulating material layer 112 such that they now have recessed upper surfaces 110Y, 112Y, respectively, that, in one embodiment, may be substantially coplanar. The amount of recessing of these materials may vary depending upon the particular application. As depicted, the recessing of these materials exposes a desired amount of the vertical height of the fins 103.

As depicted in FIG. 10, the various process operations result in the formation of a reduced-height insulating sidewall spacer 112A from the second insulating material layer 112. This reduced-height insulating sidewall spacer 112A is positioned in the gap 113 between the outer perimeter 103P of the fin 103A and, when considered collectively, both the remaining portion of the conformal liner layer 108 and the first insulating material layer 110. That is, the reduced-height insulating sidewall spacer 112A is positioned around the entire outer perimeter 103P of the fin 103A. In one particular embodiment, the insulating sidewall spacer 112A physically contacts the outer perimeter of the fin 103A for the entire vertical height of the reduced-height insulating sidewall spacer 112A. Additionally, the vertical height of the insulating sidewall spacer 112A is less than the overall vertical height 103H (see FIG. 2) of the fin 103A (the distance from the upper surface 103S to the bottom surface 105S of the trenches 105). The magnitude of this difference in height may vary depending upon the particular application, e.g., the vertical height 103H of the fin 103A may be about 35-40 nm greater than the vertical height of the sidewall spacer 112A.

Figure 11:
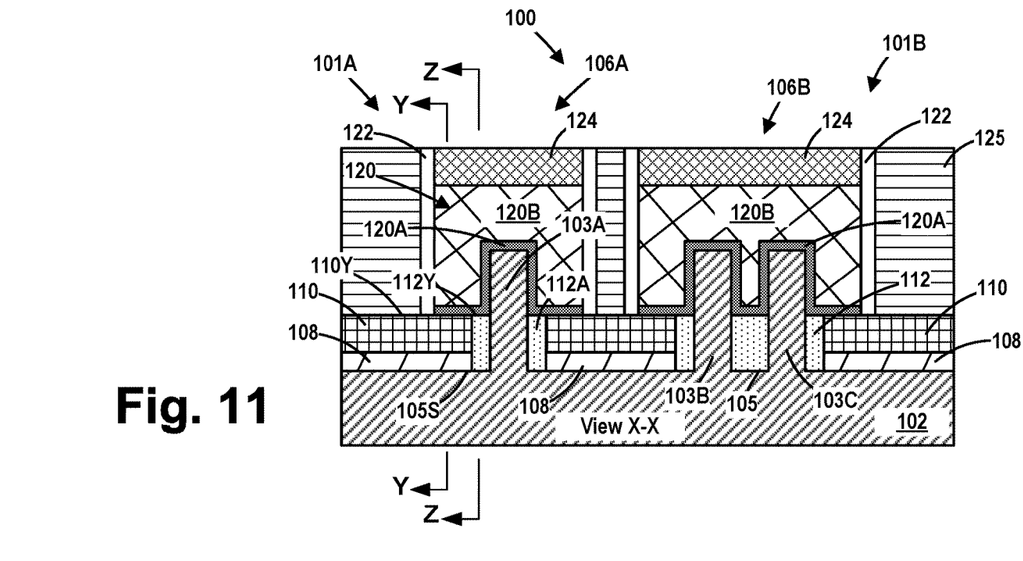

Thereafter, the above-described gates 106 may be formed on the FinFET devices 101. As noted above, the gate structures for the FinFET devices 101 may be formed using known replacement gate or gate-first manufacturing techniques. With reference to FIG. 11, in an illustrative replacement-gate manufacturing technique, a so-called "dummy" or sacrificial gate structure (not shown) including an initial (or sacrificial) gate cap layer is initially formed above the substrate 102 and patterned. Thereafter, at least one sidewall spacer 122 is formed adjacent the patterned dummy gate structure/cap layer. The dummy gate structure remains in place as many process operations are performed to form the devices 101, e.g., the formation of raised, doped source/drain regions, performing an anneal process to repair damage to the substrate, etch. At some point in such a replacement-gate process flow, the initial gate cap layer is removed by performing a chemical mechanical polishing (CMP) process relative to a layer of insulating material 125 so as to expose the dummy gate structure for further processing. Thereafter, one or more etching processes are performed to remove the dummy gate structure which results in the formation of a gate cavity (not shown) that is laterally defined by the internal surfaces of the spacer 122.

Thereafter, as shown in FIG. 11, various process operations are performed to form an illustrative final gate structure 120 and a final gate cap layer 124 for each of the FinFET devices 101. For example, after the dummy gate is removed, a conformal chemical vapor deposition (CVD) or atomic layer deposition (ALD) process may be performed to form a conformal gate insulation layer 120A comprised of a high-k layer of insulating material, e.g., hafnium oxide, silicon dioxide, in the gate cavity. Thereafter, one or more metal or metal alloy layers and/or polysilicon layers (that will become the gate electrode 120B) may be deposited in the gate cavity above the gate insulation layer 120A. A CMP process is then performed to remove excess portions of the deposited layers of material positioned outside the gate cavity and above the layer of insulating material 125. These operations result in the schematically depicted final gate structures 120. After the materials of the final replacement gate structures 120 were formed in the gate cavities, a timed, recess etching process was performed to recess the materials of the final replacement gate structure 120 so as to thereby make room for the final gate cap 124 to be formed in the replacement gate cavities above the recessed materials of the final replacement gate structures 120. The gate cap 124 was formed by depositing a layer of gate cap material, e.g., silicon nitride, across the substrate and in the gate cavities above the recessed materials of the final replacement gate structures 120 and thereafter performing a CMP process to remove the excess gate cap material positioned above the upper surface of the layer of insulating material 125. The materials of construction for the gate structures 120 may be the same for both of the FinFET devices 101A, 101B, but that may not be the case in all applications. The gate structures 120 depicted herein are intended to be representative in nature in that they are intended to represent any type of gate structure that may be formed on an IC product.

Figure 12:
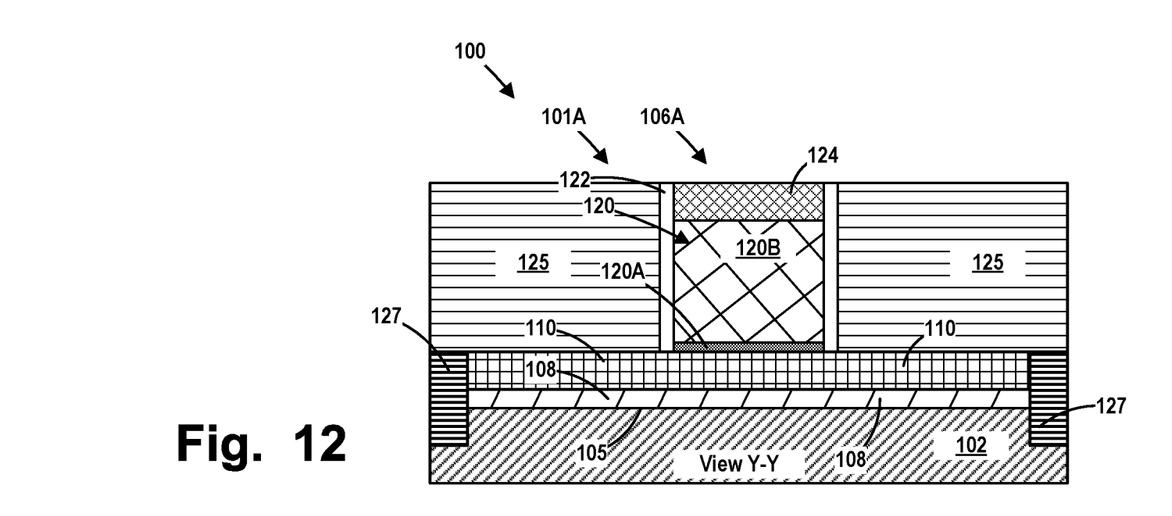
Figure 13:
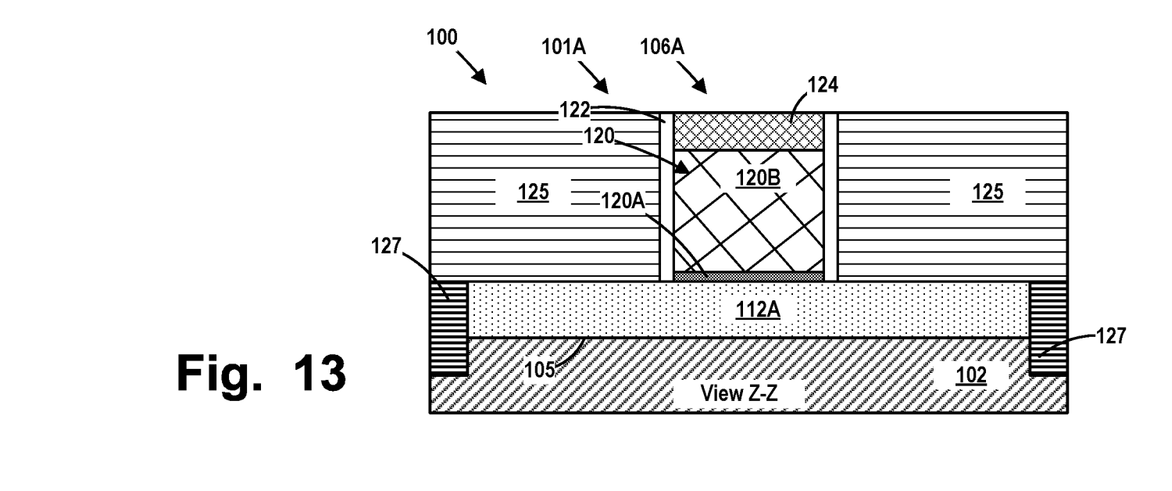

FIG. 12 is a cross-sectional view Y-Y (see FIGS. 1 and 11) taken through the gate 106A at a location above isolation material in a direction corresponding to the gate length (GL) direction of the FinFET devices 101A. FIG. 13 is a cross-sectional view Z-Z (see FIG. 11) taken through the gate 106A and through the insulating sidewall spacer 112A positioned adjacent the sidewalls 103X, 103Y of the fins 103A. With reference to these drawings, an isolation structure 127 was formed in the substrate 102 by performing traditional manufacturing techniques.

As depicted in FIG. 12, more of the gate structure 120 is positioned above the combination of the liner layer 108 and the first insulating material layer 110 as compared to how much of the gate structure 120 is positioned above the insulating sidewall spacer 112A. As also depicted in FIGS. 12 and 13, in one illustrative embodiment, the insulating sidewall spacer 112A is positioned on and in physical contact with sidewall surfaces 103X, 103Y (as well as the end surfaces 103T, 103U) of the lower portion of the fin 103 and on and in physical contact with the bottom surface 105S of the trenches 105. Stated another way, in one illustrative embodiment, the reduced-height insulating sidewall spacer 112A may be positioned on and in physical contact with the outer perimeter 103P of the lower portion of the fin 103A. In one particular embodiment, the combination of the liner layer 108 and the first insulating material layer 110 laterally abut and engage the insulating sidewall spacer 112A. In one embodiment, the liner layer 108 is also positioned on and in contact with the bottom surface 105S of the trenches 105. The bottom surface of the first insulating material layer 110 may also be positioned on and in contact with the upper surface of the liner layer 108. It should also be noted that, as shown in FIG. 11, the gate insulation layer 120A is positioned on the upper surface of the insulating sidewall spacer 112A and on a portion of the upper surface 110Y of the first insulating material layer 110 around the outer perimeter of the fin 103A. In some embodiments, the gate insulation layer 120A may be in physical contact with the upper surface of the insulating sidewall spacer 112A and in physical contact with a portion of the upper surface 110Y of the first insulating material layer 110 around the outer perimeter of the fin 103A.

It should also be noted that, in one illustrative embodiment, the liner layer 108, the first insulating material layer 110 and the second insulating material layer 112 are all made of different insulating materials and/or have different mechanical properties. For example, in one illustrative embodiment, the liner layer 108 may be made of flowable oxide, the first insulating material layer 110 may be made of a high density plasma (HDP) oxide or a high aspect ratio process (HARP) oxide and the second insulating material layer 112 may be made of aluminum oxide ($Al_2O_3$).

As will be appreciated by those skilled in the art after a complete reading of the present application, various novel devices are disclosed herein. One illustrative transistor device disclosed herein includes a single semiconductor structure (such as a fin for a FinFET device or a vertically oriented semiconductor structure for a vertical transistor device) having an outer perimeter and a vertical height, wherein the single semiconductor structure is at least partially defined by a trench 105 formed in a semiconductor substrate 102, and a first layer of material 108 positioned on the bottom surface of the trench 105 and around the outer perimeter 103P, 104P of the single semiconductor structure. The device also includes a second layer of material 110 positioned on the first layer of material 108 and around the outer perimeter 103P, 104P of the single semiconductor structure, a gap 113 between the outer perimeter 103P, 104P of the single semiconductor structure and both the first and second layers of material 108, 110 (when considered collectively) and an insulating sidewall spacer 112A positioned in the gap 113, wherein the insulating sidewall spacer 112A has a vertical height that is less than the vertical height of the single semiconductor structure.

One illustrative single fin FinFET device 101A disclosed herein includes a single fin 103A comprising first and second opposing sidewalls 103X, 103Y and a vertical height wherein the single fin 103A is at least partially defined by first and second trenches 105 formed in a semiconductor substrate 102 adjacent the first and second opposing sidewalls 103X, 103Y, respectively. The device also includes an insulating sidewall spacer 112A positioned on the first and second opposing sidewalls 103X, 103Y, wherein the insulating sidewall spacer 112A has a vertical height that is less than the vertical height of the single fin 103A and wherein a bottom surface of the insulating sidewall spacer 1112A is positioned on the bottom surface 105S of the first and second trenches 105. The device also includes first and second layers of material 108 positioned on the bottom surface 105S of the first and second trenches 105, respectively, wherein the first and second layers of material 108 abut and engage the insulating sidewall spacer 112A. The device also includes first and second layers of insulating material 110 positioned on the first and second layers of material 108, respectively, wherein the first and second layers of insulating material 110 also abut and engage the insulating sidewall spacer 112A.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

The invention claimed is:

1. A transistor, comprising:
   a single semiconductor structure having an outer perimeter and a vertical height, the single semiconductor structure being at least partially defined by a trench formed in a semiconductor substrate, said trench comprising a bottom surface;

a first layer of material positioned on the bottom surface of the trench and around the outer perimeter of the single semiconductor structure, wherein the first layer of material includes silicon germanium (SiGe) or a metal oxide;

a second layer of material positioned on the first layer of material and around the outer perimeter of the single semiconductor structure, wherein the second layer of material includes an oxide and is different from the first layer of material;

a gap between the outer perimeter of the single semiconductor structure and both the first and second layers of material when considered collectively; and an insulating sidewall spacer positioned in the gap, the insulating sidewall spacer having a vertical height that is less than the vertical height of the single semiconductor structure, wherein the insulating sidewall spacer includes a flowable oxide (FCVD) or a spin-on oxide (SOD), wherein the material of the insulating sidewall spacer has a first hardness and the material of the second layer of material has a second hardness, wherein the first hardness is less than the second hardness.

2. The transistor of claim 1, wherein the second layer of material comprises an upper surface and wherein the upper surface of the insulating sidewall spacer is substantially coplanar with the upper surface of the second layer of material.

3. The transistor of claim 1, wherein the second layer of material comprises an upper surface and wherein the transistor further comprises a gate structure comprising a gate insulation layer, wherein the gate insulation layer contacts the upper surface of the insulating sidewall spacer and a portion of the upper surface of the second layer of material.

4. The transistor of claim 1, wherein the first layer of material includes silicon germanium (SiGe) or the metal oxide comprising one of aluminum oxide (Al2O3) and titanium oxide (TiO2), and the oxide of the second layer of material comprises one of silicon dioxide, an high density plasma (HDP oxide), or a high aspect ratio process (HARP) oxide.

5. The transistor of claim 1, wherein the first layer of material comprises an upper surface and wherein the insulating sidewall spacer is positioned on and in physical contact with the outer perimeter of the single semiconductor structure for the entire vertical height of the insulating sidewall spacer, the first layer of material is positioned on and in physical contact with the bottom surface of the trench, and the second layer of material is positioned on and in physical contact with the upper surface of the first layer of material.

6. The transistor of claim 1, wherein a surface of the first layer of material physically contacts the insulating sidewall spacer and wherein a surface of the second layer of material physically contacts the insulating sidewall spacer.

7. The transistor of claim 1, wherein the first hardness being less than the second hardness mitigates stress on the single semiconductor structure during an annealing process.

8. The transistor of claim 1, wherein the vertical height of the single semiconductor structure may be about 35-40 nm greater than the vertical height of the insulating sidewall spacer.

9. The transistor of claim 1, wherein the transistor is a FinFET transistor and wherein the single semiconductor structure is a single fin having a long axis that is oriented substantially horizontal relative to an upper surface of the semiconductor substrate.

10. The transistor of claim 1, wherein the transistor is a vertical transistor and wherein the single semiconductor structure is a single vertically oriented semiconductor structure having a long axis that is oriented substantially vertical relative to an upper surface of the semiconductor substrate.

11. The transistor of claim 1, wherein the first layer of material abuts and engages the insulating sidewall spacer and wherein the second layer of material abuts and engages the insulating sidewall spacer.

12. A transistor, comprising:
a single semiconductor structure having an outer perimeter and a vertical height, the single semiconductor structure being at least partially defined by a trench formed in a semiconductor substrate, the trench comprising a bottom surface;

a first layer of material positioned on the bottom surface of the trench and around the outer perimeter of the single semiconductor structure, wherein the first layer of material includes silicon germanium (SiGe) or a metal oxide;

a second layer of material positioned on the first layer of material and around the outer perimeter of the single semiconductor structure, wherein the second layer of material comprises an upper surface, and the second layer of material includes an oxide and is different from the first layer of material;

a gap between the outer perimeter of the single semiconductor structure and both the first and second layers of material when considered collectively; and an insulating sidewall spacer positioned in the gap, the insulating sidewall spacer having an upper surface and a vertical height, wherein the vertical height of the insulating sidewall spacer is less than the vertical height of the single semiconductor structure and wherein the upper surface of the insulating sidewall spacer is substantially coplanar with the upper surface of the second layer of material, wherein the insulating sidewall spacer includes a flowable oxide (FCVD) or a spin-on oxide (SOD), wherein the material of the insulating sidewall spacer has a first hardness and the material of the second layer of material has a second hardness, wherein the first hardness is less than the second hardness.

13. The transistor of claim 12, wherein the transistor further comprises a gate structure comprising a gate insulation layer, wherein the gate insulation layer contacts the upper surface of the insulating sidewall spacer and a portion of the upper surface of the second layer of material.

14. The transistor of claim 12, wherein the first layer of material comprises an upper surface and wherein the insulating sidewall spacer is positioned on and in physical contact with the outer perimeter of the single semiconductor structure for the entire vertical height of the insulating sidewall spacer, the first layer of material is positioned on and in physical contact with the bottom surface of the trench, and the second layer of material is positioned on and in physical contact with the upper surface of the first layer of material.

15. The transistor of claim 12, wherein the first layer of material abuts and engages the insulating sidewall spacer and wherein the second layer of material abuts and engages the insulating sidewall spacer.

16. A transistor, comprising:
a single semiconductor structure having an outer perimeter and a vertical height, the single semiconductor structure being at least partially defined by a trench formed in a semiconductor substrate, the trench comprising a bottom surface;
a first layer of material positioned on the bottom surface of the trench and around the outer perimeter of the single semiconductor structure;
a second layer of material positioned on the first layer of material and around the outer perimeter of the single semiconductor structure, wherein the second layer of material comprises an upper surface;
a gap between the outer perimeter of the single semiconductor structure and both the first and second layers of material when considered collectively; and
an insulating sidewall spacer positioned in the gap, the insulating sidewall spacer having an upper surface and a vertical height, wherein the vertical height of the insulating sidewall spacer is less than the vertical height of the single semiconductor structure, wherein the upper surface of the insulating sidewall spacer is substantially coplanar with the upper surface of the second layer of material, wherein the first layer of material abuts and engages the insulating sidewall spacer and wherein the second layer of material abuts and engages the insulating sidewall spacer,
wherein the insulating sidewall spacer comprises one of a flowable oxide (FCVD), and a spin-on oxide (SOD), the first layer of material comprises one of aluminum oxide (Al2O3), silicon germanium (SiGe), and titanium oxide (TiO2), and the second layer of material comprises one of silicon dioxide, a high density plasma (HDP) oxide, or a high aspect ratio process (HARP) oxide.

17. The transistor of claim 16, wherein the insulating sidewall spacer is positioned on and in physical contact with the outer perimeter of the single semiconductor structure for the entire vertical height of the insulating sidewall spacer, the first layer of material is positioned on and in physical contact with the bottom surface of the trench, and the second layer of material is positioned on and in physical contact with the upper surface of the first layer of material.

18. The transistor of claim 17, wherein the material of the insulating sidewall spacer has a first hardness and the material of the second layer of material has a second hardness, wherein the first hardness is less than the second hardness.

19. The transistor of claim 12, wherein the first layer of material includes silicon germanium (SiGe) or the metal oxide comprising one of aluminum oxide (Al2O3) and titanium oxide (TiO2), and the oxide of the second layer of material comprises one of silicon dioxide, a high density plasma (HDP) oxide, or a high aspect ratio process (HARP) oxide.

* * * * *